(12) United States Patent
Gunderson et al.

(10) Patent No.: US 6,433,405 B1
(45) Date of Patent: Aug. 13, 2002

(54) INTEGRATED CIRCUIT HAVING PROVISIONS FOR REMOTE STORAGE OF CHIP SPECIFIC OPERATING PARAMETERS

(75) Inventors: Jason R Gunderson; Fred Gross, both of Ft. Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/518,067

(22) Filed: Mar. 2, 2000

(51) Int. Cl.[7] .............................................. H01L 29/00
(52) U.S. Cl. ...................... 257/529; 257/202; 257/209; 365/96; 365/222; 365/225.7; 438/6; 438/132
(58) Field of Search ......................... 257/209, 52, 202, 257/207, 208, 528; 438/6, 132; 365/96, 225.7, 222

(56) References Cited

U.S. PATENT DOCUMENTS

| | | | | |
|---|---|---|---|---|
| 4,612,640 A | * | 9/1986 | Mehrotra et al. | 371/51 |
| 5,703,823 A | * | 12/1997 | Douse et al. | 365/222 |
| 5,835,425 A | * | 11/1998 | Berger | 365/200 |
| 5,844,296 A | * | 12/1998 | Murray et al. | 257/529 |
| 5,859,801 A | * | 1/1999 | Poechmueller | 365/200 |

FOREIGN PATENT DOCUMENTS

JP        10055698 A   *  2/1998

* cited by examiner

*Primary Examiner*—Nathan Flynn
*Assistant Examiner*—Remmon R. Fordé

(57) ABSTRACT

An integrated circuit having programmable fuse provisions separate from critical circuitry, for storing chip specific operational information necessary for proper integrated circuit operation. These separate provisions include a fuse block which contains the programmable fuse. The fuse block is positioned adjacent to a current source input which is used to provide current to the programmable fuse for purposes of programming the programmable fuse with the chip specific operational information.

11 Claims, 5 Drawing Sheets

INTEGRATED CIRCUIT HAVING PROVISIONS FOR REMOTE STORAGE OF CHIP SPECIFIC OPERATING PARAMETERS

TECHNICAL FIELD

The present invention is generally related to an integrated circuit in which fuses for programming the integrated circuit are located so as to maximize probability of successful programming. More particularly, the present invention relates to an integrated circuit in which programming fuses are located within a predefined fuse block area separate from critical circuitry blocks.

BACKGROUND OF THE INVENTION

Certain type integrated circuits must be programmed during manufacture to store chip-specific operational information necessary for the integrated circuit to function as intended when powered up for use. Such chip specific information includes, but is not limited to, redundancy programming information, clock programming information and chip serial number identification. Each piece of information may be unique to each integrated circuit manufactured.

This chip specific operational information has been stored via non-volatile programmable storage fuses. Non-volatile storage fuses are typically physically very large and require a great deal of integrated circuit real estate. Fuses are typically located and interspersed throughout the critical circuitry area of the integrated circuit near the circuitry that uses the information stored in the particular fuse. This often means that fuses are located at distant points relative to the power supply pads that feed power (current) to the integrated circuit. Further, over the years technology has made it possible to decrease the size of critical circuitry and thereby increase the density of critical circuitry for a given area of integrated circuitry real estate. However, while the density of critical circuitry has increased, the size of programmable fuses has remained largely the same. Thus, the fuse size relative to the critical circuitry that surrounds it is substantially larger. As a result, overall performance of critical circuitry is impacted as circuitry must be routed around the substantially larger programmable fuses interspersed throughout the critical circuitry area. Circuit performance is often not optimal due to the additional circuitry necessary to route signals around the adjacent programming fuses.

Electrically programmable fuses are programmed during manufacture by "blowing" the selected fuses within the integrated circuit to open select signal paths. During the process of blowing the selected fuses, a high current is typically delivered to the selected fuses to cause them to open (i.e. blow). Sometimes current applied to the selected fuses is not sufficient to blow the fuses thus, the programming process fails and yields the integrated circuit non-functional. Where too many fuses are being programmed (blown) at one time, the current limits of the power supply supplying the programming current may be reached or exceeded and insufficient current may be delivered to one or more of the fuses being programmed. This results in improper programming of the fuses and thus yields a non-functional integrated circuit. Further, as the location of fuses in the integrated circuit is further from the power supply pads which provide power (current) to the integrated circuit, the chance that insufficient current will be delivered to the fuse is increased. Fuses are used (read) at power-up of the integrated circuit and are not timing critical.

FIG. 1 illustrates a typical integrated circuit. There is provided a critical circuitry block 5 that contains operational circuitry not related to programming fuses, as well as fuse circuitry 11 which is interspersed throughout circuitry block 5. There is also provided power supply pads 20 by which power (current) is supplied to the integrated circuit 1 for programming and normal operation.

Thus, a heretofore unaddressed need exists in the industry to address the aforementioned deficiencies and inadequacies.

SUMMARY OF THE INVENTION

The present invention provides an apparatus and method for storing chip specific operating parameters remotely from critical circuitry. Briefly described, in architecture, the system can be implemented as follows. An integrated circuit is provided which incorporates a fuse block and a critical circuitry block. The fuse block contains a programmable fuse for storing chip specific operational information. The present invention can also be viewed as providing a method for programming an integrated circuit with chip specific operational information. In this regard, the method can be broadly summarized by the following steps: receiving chip specific operating parameter information; temporarily storing said received operating parameter information; and programming said operating parameter information into a corresponding programmable storage fuse located in a fuse block on the integrated circuit.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

The present invention seeks to solve the problems caused by programming too many programming fuses at one time so as to exceed the current limits of the programming power supply. Further the present invention provides for programming of programming fuses via both the IEEE 1149.1 JTAG scan method, in which no active CPU is required for programming the fuses and the Remote Diagnosis Register (RDR) scan method, in which an active CPU is required for programming.

Figure 1:
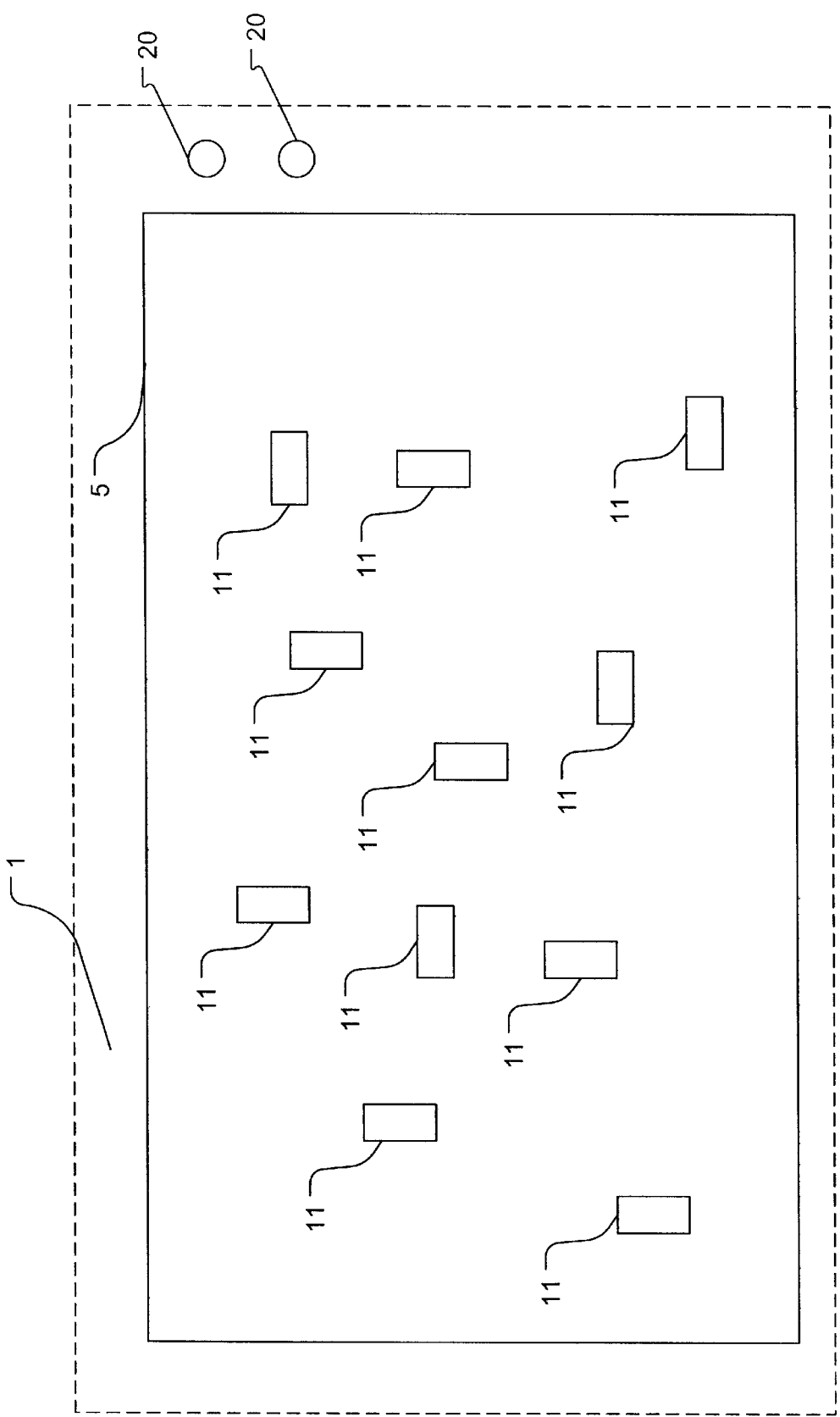
FIG. 1 is a diagram illustrating a typical integrated circuit having fuse provisions.
Figure 2:
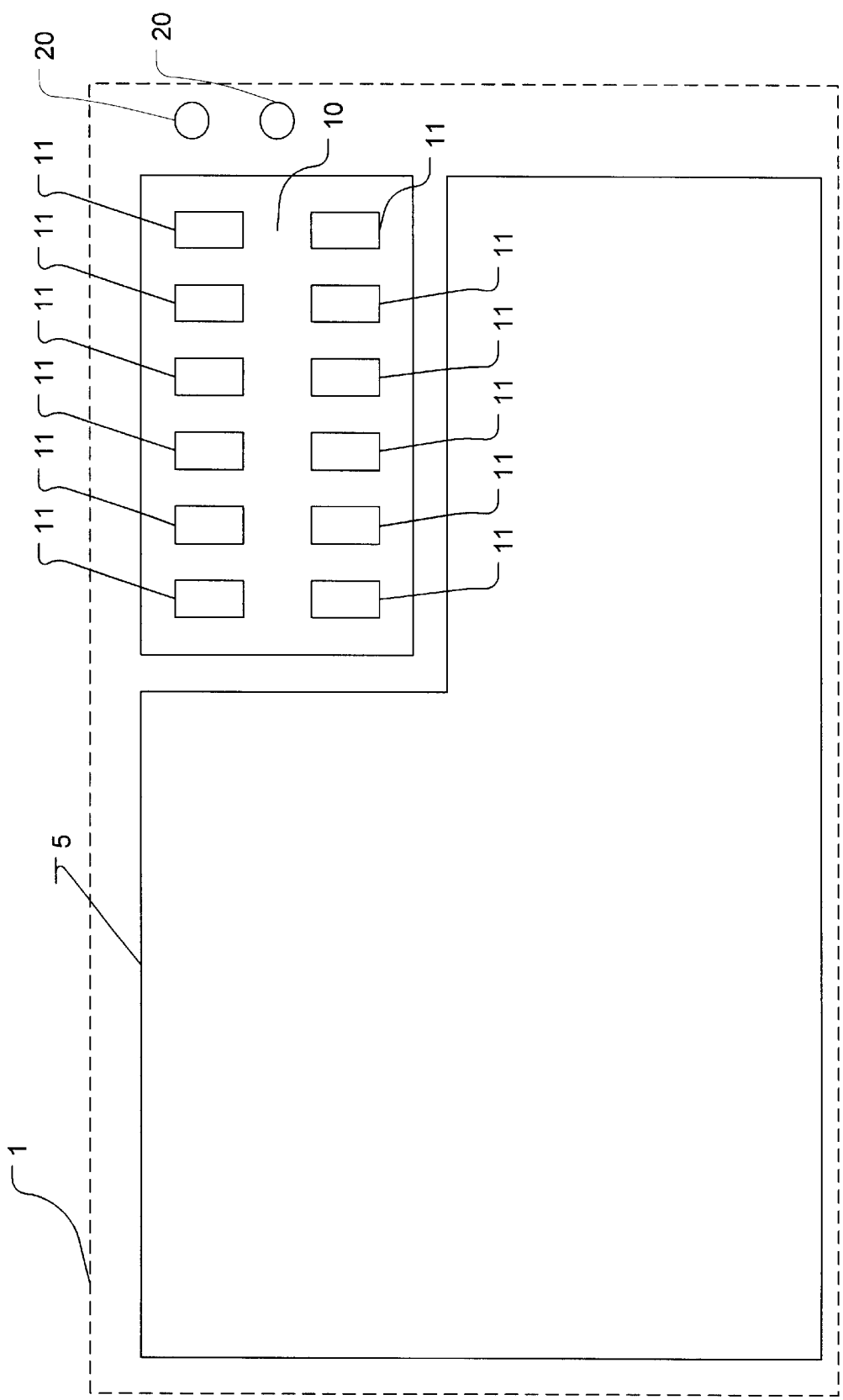
FIG. 2 is a diagram illustrating the present invention.

With reference to FIG. 2 an integrated circuit 1 according to the present invention is illustrated. There is provided a critical circuitry block 5 and a fuse block 10. Fuse block 10 is located adjacent to power supply pads 20. Fuse block 10 contains a number of individual fuses 11, each of which store operational information relevant to a particular block of circuitry contained in circuitry block 5.

Figure 2A:
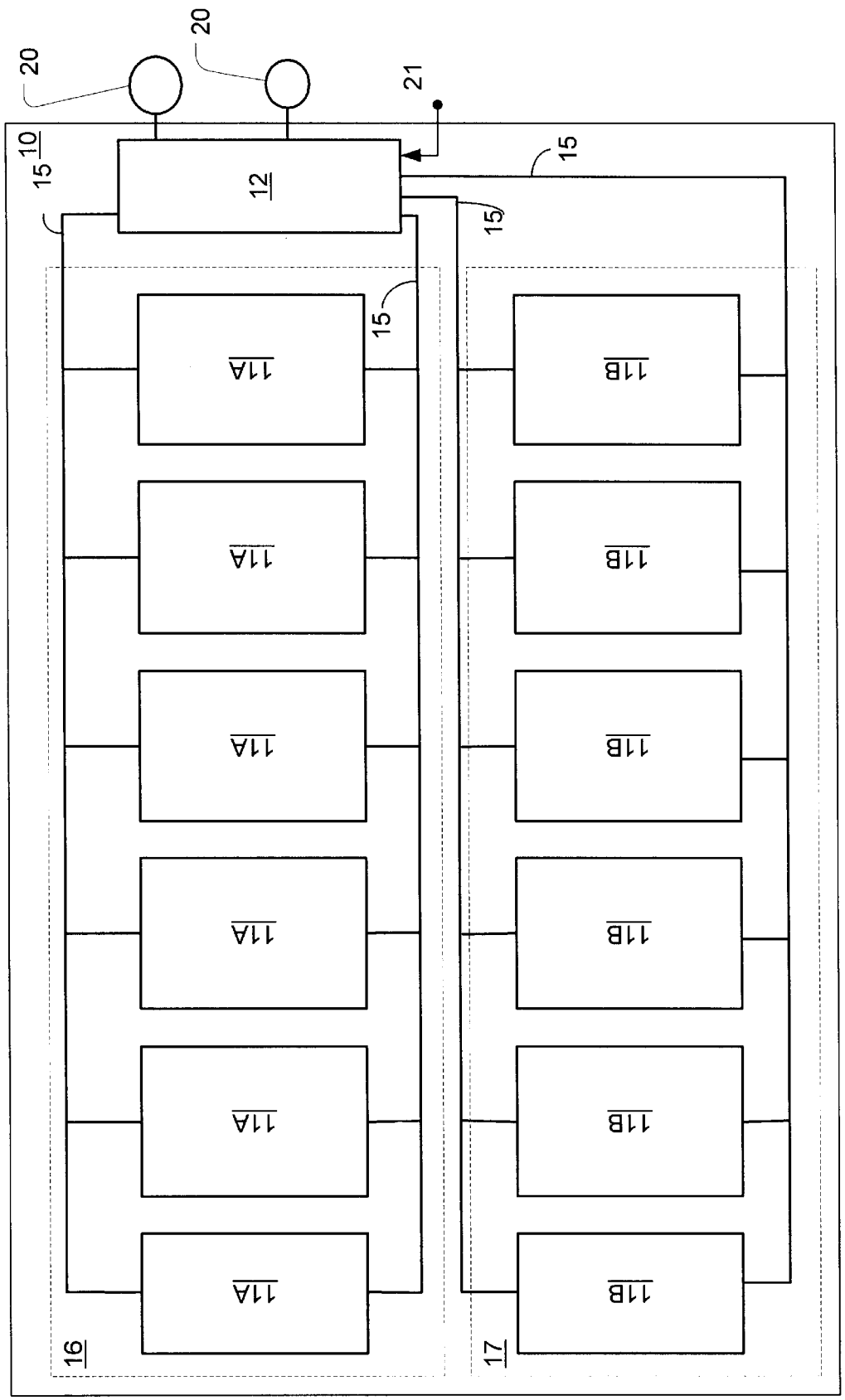
FIG. 2A is a diagram illustrating an embodiment of a fuse block according to the present invention.

FIG. 2A illustrates a further example of a fuse block 10 in which the fuses are electrically programmable. Here it can be seen by way of example that each of fuses 11 may be grouped by operational function into two groups, Group A 16 and Group B 17. Both Group A 16 and Group B 17 are connected by a series of wiring traces 15 to a switch 12. Switch 12 is provided to selectively apply power from power supply pads 20 to the fuses 11 via wiring traces 15. Switch 12 works in conjunction with programming latch 34 (FIG. 3) and receives control signals via input 21. Fuses 11 are programmed via switching power to the Group (A or B) which is desired to be programmed. If necessary, additional groups of fuses can be assembled to accommodate the needs at hand.

In order to maximize the probability that programming of the integrated circuit 1 is successful, the present invention provides for locating relevant fuse circuitry within a pre-defined fuse area (fuse block) 10 on the integrated circuit 1 separate from critical, non-fuse related circuitry blocks 5. This fuse block 10 is preferably positioned adjacent to power supply pads 20 that feed power (current) to the integrated circuit 1 during programming operations, to minimize current loss due to long current paths from power supply 20 to a fuse 11. By positioning the fuse block 10 adjacent to the power supply pads 20, current dissipation prior to reaching the select fuse 11 to be programmed (blown) is minimized and thus increases the probability that programming of the integrated circuit 1 will be successful.

Fuses 11 may be physically arranged within the fuse block 10 so as to place fuses related, for example, to data cache, instruction cache, clock programming or serial number programming together in their own sections. These sections can then, for example, be separately enabled during the process of programming the fuses 11 so that only those fuses 11 of a particular selected group or section can be enabled and programmed at a time. By doing this, it is possible to enhance the probability that sufficient current will be available to properly program the fuses 11.

Figure 3:
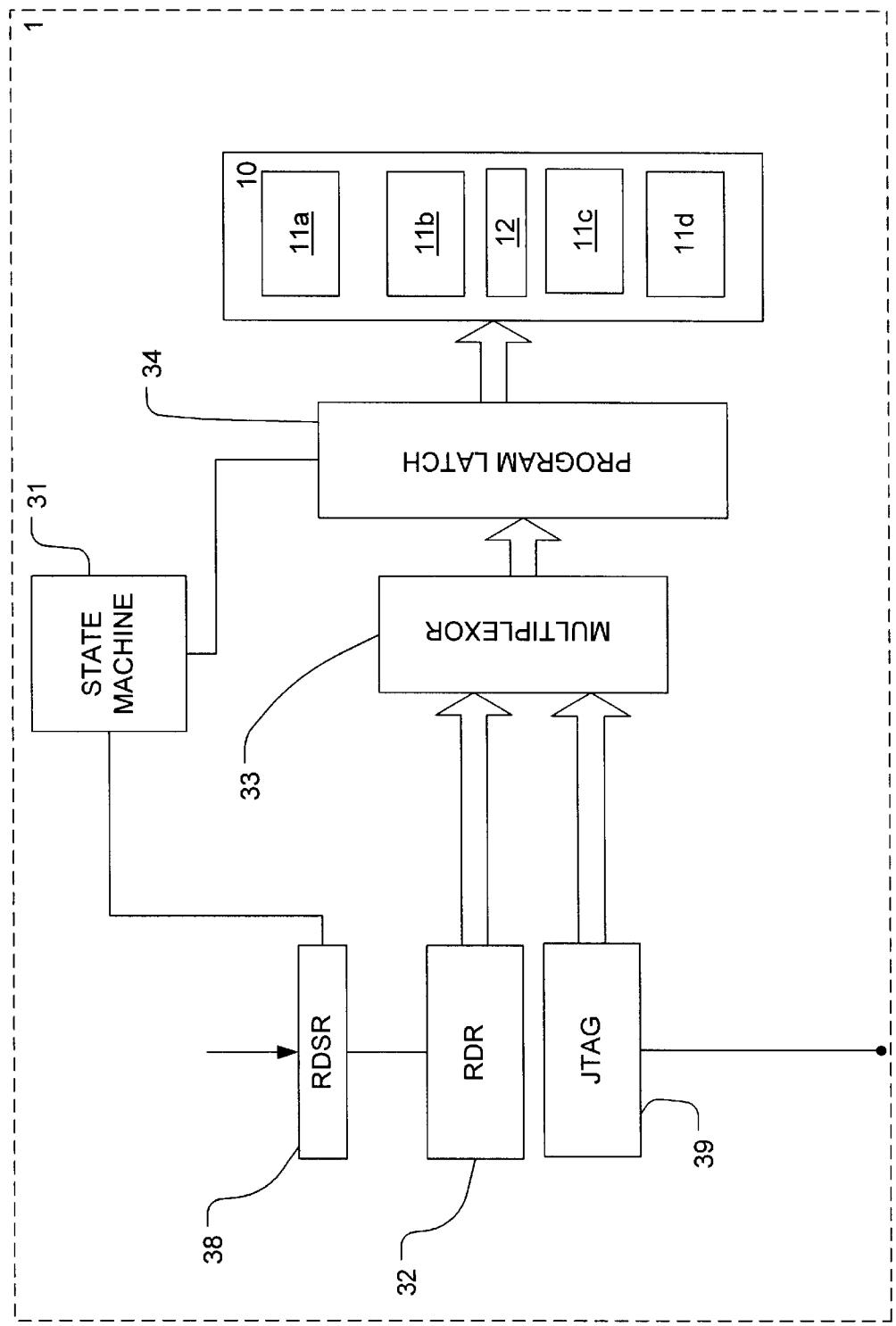
FIG. 3 is a block diagram illustrating one embodiment of the present invention.

In order to accommodate both JTAG and RDR scan methods, a multiplexor 33 is provided as shown in FIG. 3. Multiplexor 33 provides the ability to select from, for example, either the input of a JTAG scan chain or a RDR scan chain for use in providing data to program the fuses 11 of fuse block 10.

With the RDR scan method, a Remote Diagnosis Register (RDR) scan latch 32 is provided from which data to be programmed into the fuses 11 is shifted to a fuse program latch 34 via a multiplexor 33. Multiplexor 33 is essentially a switch which switches between the input of RDR scan latch 32 or JTAG register 39 and provides this input to programming latch 34. RDR scan latch 32 receives data input from a remote diagnosis staging register 38. RDR scan latch 32 is for example, 230 bits in length, while remote diagnosis staging register 38 is, for example, 64 bits in length. Fuse programming latch 34 is for example 230 bits in length. Multiplexor 33 is, for example, 230 bits in length. In order for all 230 bits of programming data to be loaded into fuse programming latch 34 from remote diagnosis register scan latch 32, remote diagnosis staging register 38 must complete four (4) full shifts of data into remote diagnosis register scan latch 32. In order to make certain that shifting of data from remote diagnosis staging register 38 to remote diagnosis register scan latch 32 is completed accurately, a state machine 31 is provided. State machine 31 maintains count of the number of shift cycles of remote diagnosis staging register 32. When four cycles have been completed, state machine 31 issues a signal indicating a complete shifting of programming data into programming latch 34 from the remote diagnosis register scan latch 32. At this point an external fuse burn signal 38 is initiated which causes the programming data stored in programming latch 34 to be burned into the fuses 11. As an alternative to programming all 230 bits of programming data into the fuses 11 at one time, it is possible to incrementally program the fuses 11. More particularly, it is possible to program only a select few fuses at a time until all fuses to be programmed have been programmed. This can be accomplished by, for example, selectively enabling only a selected group or portion of fuses 11 for reception of programming data from programming latch 34. By incrementally programming fuses, it is possible to limit the draw on available programming current and thereby make it more probable that sufficient current will be available to program the selected fuses.

In order to allow for selective enabling and programming of the fuses 11, fuses 11 can be laid out within the fuse block 10 by groups (11a–11d). For example, with reference to FIG. 3, fuses related to dcache (data cache) redundancy (11a) and icache (instruction cache) redundancy (11b) can be controlled by four (4) enable bits of, for example, an 8-bit enable signal. While fuses 11 which are related to, for example, clock programming (11c)and serial number information (11d) that are laid out within the fuse block 5 are controlled by another four enable bits of an enable signal. In one embodiment of the present invention, the circuitry shown in FIG. 3 is implemented as a part of fuse block 10.

Figure 4:
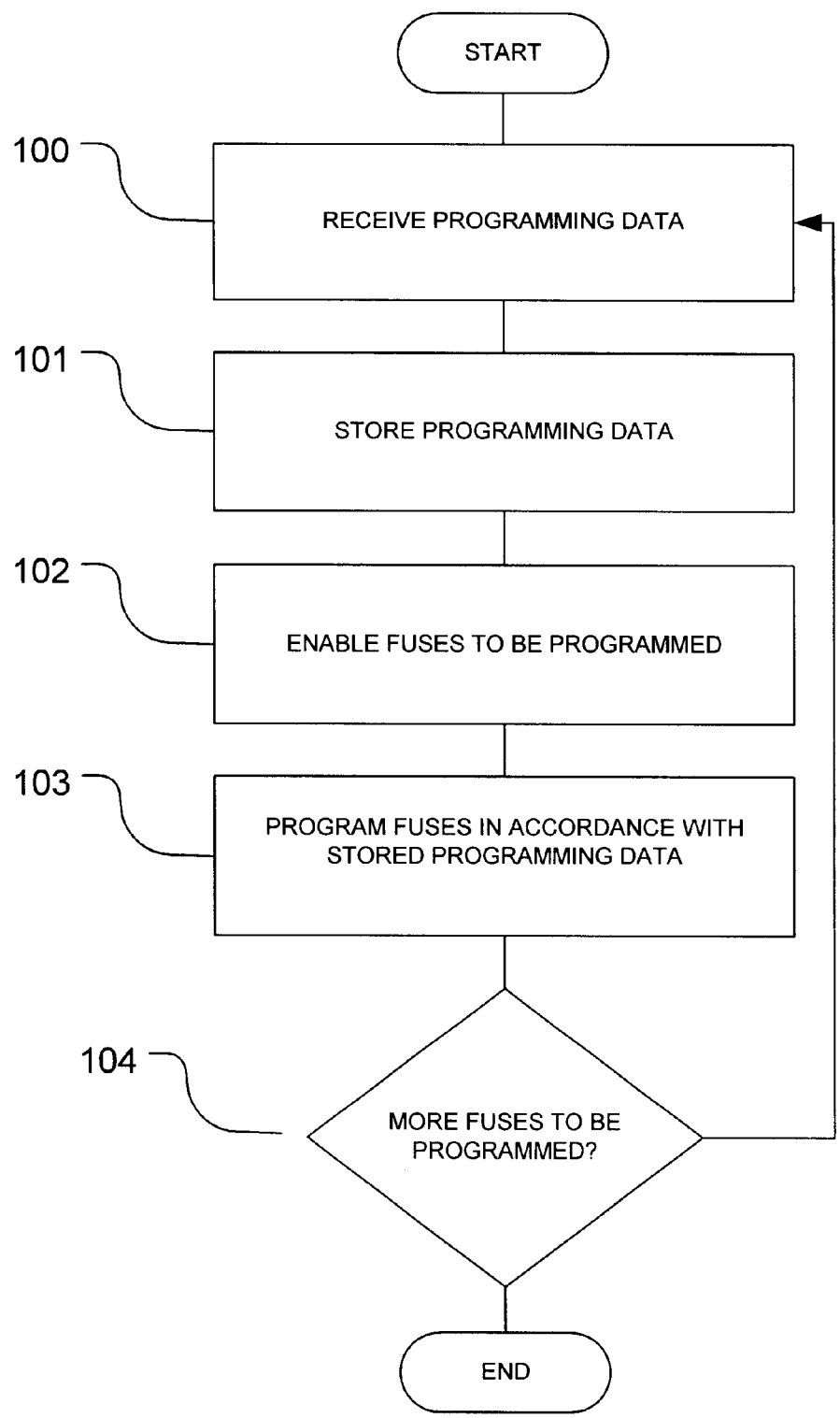
FIG. 4 is a flowchart illustrating the method of the present invention.

FIG. 4 is a flowchart outlining the method of the present invention. Here it can be seen that at step 100 programming data is selected and received from an input source (typically a JTAG scan chain or a RDR scan chain) via a switching means, such as multiplexor 33. The input of programming data may come from, for example, an EEE JTAG compliant scan chain or a remote diagnosis scan chain 32 depending upon which input is selected. As programming of critical operation information in accordance with the IEEE 1149.1 (JTAG) standard is well known, it will not be further discussed herein. However, the provisions and disclosure of IEEE standard 1149.1 JTAG programming is incorporated herein by reference.

Once programming data is input it is then transferred and stored in a storage device such as programming latch 34 (Step 101). Selected fuses to be programmed are enabled (STEP 102). The programming data stored in programming latch 34 is then burned into selected fuses 11 in fuse block 5 (STEP 103). Where additional fuses are to be burned, steps 100–103 are repeated (STEP 104).

It will be recognized by those skilled in the art, that the programmable fuse 11 may be either electrically programmable or laser programmable. It will also be recognized that the programming procedure for a laser programmable fuse 11 will differ from that required by an electrically programmable fuse 11.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. An integrated circuit comprising:
   a fuseblock comprising a fuse for storing operational information;
   a critical circuitry block comprising critical operating circuitry;
   provisions for programming said fuse; and
   said fuseblock is physically located adjacent to said provisions for programming said fuse.

2. An integrated circuit according to claim 1 wherein said fuse block comprises a plurality of programmable fuses for storing operational information.

3. An integrated circuit according to claim 1 wherein said provisions for programming said fuse comprises a power pad for receiving an electrical current for programming said fuse;
   said fuseblock receives electrical current from said power pad via a conductor; and
   said fuseblock is positioned adjacent to said power pad so as to minimize the length of said conductor.

4. An integrated circuit according to claim 3 further comprising:
   a switch for selecting between available programming data sources;
   a programming latch for receiving and storing programming data via said switch; and
   a state machine for counting the number of times data is input from a programming data source.

5. An integrated circuit according to claim 4 wherein said programming latch is of sufficient length to provide all fuses to be programmed with corresponding programming data.

6. An integrated circuit according to claim 1 wherein said fuse is directed to a particular function.

7. An integrated circuit comprising:
   a fuseblock;
   a critical circuitry block located adjacent to said fuseblock;
   said critical circuitry block comprises critical operating circuitry;
   said fuseblock comprises an electrically programmable fuse;
   power pad for receiving an electrical current for programming said fuse;
   said fuseblock receives said electrical current from said power pad via a conductor; and
   said fuseblock is positioned adjacent to said power pad so as to limit the distance said conductor must span between said fuseblock and said power pad.

8. An integrated circuit according to claim 7 wherein said fuseblock comprises a plurality of fuses.

9. An integrated circuit according to claim 8 further comprising:
   a switch for selecting between input of a plurality of programming data sources; and
   a programming latch for storing programming data received via said switch.

10. An integrated circuit according to claim 9 further comprising a state machine for counting the number of times programming data is input from a programming data source.

11. An integrated circuit according to claim 10 wherein said programming latch is of sufficient length to provide all of said fuses to be programmed with corresponding programming data.

* * * * *